United States Patent
Barth, Jr. et al.

(10) Patent No.: US 9,224,437 B2
(45) Date of Patent: Dec. 29, 2015

(54) GATED-FEEDBACK SENSE AMPLIFIER FOR SINGLE-ENDED LOCAL BIT-LINE MEMORIES

(71) Applicant: GLOBALFOUNDRIES Inc., Grand Cayman (KY)

(72) Inventors: John E. Barth, Jr., Williston, VT (US); Abraham Mathews, Austin, TX (US); Donald W. Plass, Poughkeepsie, NY (US); Kenneth J. Reyer, Stormville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/068,653

(22) Filed: Oct. 31, 2013

(65) Prior Publication Data

US 2015/0117120 A1   Apr. 30, 2015

(51) Int. Cl.
*G11C 7/06* (2006.01)
*G11C 11/4091* (2006.01)
*G11C 7/10* (2006.01)
*G11C 7/12* (2006.01)
*G11C 11/4094* (2006.01)

(52) U.S. Cl.
CPC .............. *G11C 7/067* (2013.01); *G11C 7/1048* (2013.01); *G11C 7/12* (2013.01); *G11C 11/4091* (2013.01); *G11C 11/4094* (2013.01)

(58) Field of Classification Search
CPC ........ G11C 7/067; G11C 7/1048; G11C 7/12; G11C 11/4091; G11C 11/4094
USPC ..................................... 365/189.05, 205, 222
See application file for complete search history.

(56) References Cited

U.S. PATENT DOCUMENTS

| | | | |
|---|---|---|---|
| 3,764,906 A | 10/1973 | Heller | |
| 4,010,453 A | 3/1977 | Lewis | |
| 4,270,190 A * | 5/1981 | Jindra | G11C 17/12 327/51 |
| 4,701,644 A * | 10/1987 | Campione | G11C 7/062 327/208 |
| 5,835,432 A * | 11/1998 | Nakano | G11C 7/067 365/204 |
| 6,433,589 B1 | 8/2002 | Lee | |

(Continued)

OTHER PUBLICATIONS

Takahashi et al., "A New Contact Programming ROM Architecture for Digital Signal Processor", 1998 Symposium on VLSI Circuits Digest of Technical Papers, pp. 158-161, 1998.*

(Continued)

*Primary Examiner* — Vu Le
*Assistant Examiner* — Sung Cho
(74) *Attorney, Agent, or Firm* — Catherine Ivers; Andrew M. Calderon; Roberts Mlotkowski, Safran & Cole PC

(57) ABSTRACT

A single-ended input sense amplifier uses a pass device to couple the input local bit-line to a global bit-line evaluation node. The sense amplifier also includes a pair of cross-coupled inverters, a first inverter of which has an input that coupled directly to the global bit-line evaluation node. The output of the second inverter is selectively coupled to the global bit-line evaluation node in response to a control signal, so that when the pass device is active, the local bit line charges or discharges the global bit-line evaluation node without being affected substantially by a state of the output of the second inverter. When the control signal is in the other state, the cross-coupled inverter forms a latch. An internal output control circuit of the second inverter interrupts the feedback provided by the second inverter in response to the control signal.

20 Claims, 6 Drawing Sheets

(56) References Cited

U.S. PATENT DOCUMENTS

| | | | |
|---|---|---|---|
| 6,618,289 B2 | 9/2003 | Pathak et al. | |
| 6,871,155 B2 * | 3/2005 | Huang | G11C 7/067 365/203 |
| 7,272,059 B2 | 9/2007 | Vimercati et al. | |
| 7,466,617 B2 * | 12/2008 | Luk | G11C 7/12 365/205 |
| 7,990,759 B2 | 8/2011 | Nicolaidis et al. | |
| 8,315,119 B2 | 11/2012 | Upputuri | |
| 8,339,884 B2 * | 12/2012 | Huang | G11C 7/067 365/185.05 |
| 8,374,043 B2 | 2/2013 | Lee et al. | |
| 8,432,762 B2 | 4/2013 | Kim et al. | |
| 2008/0056039 A1 * | 3/2008 | Kim | G11C 7/06 365/205 |
| 2009/0147590 A1 * | 6/2009 | Correale, Jr. | G11C 7/1051 365/189.05 |
| 2012/0051127 A1 * | 3/2012 | Yoon | G11C 13/0004 365/163 |
| 2012/0230130 A1 | 9/2012 | Sheppard | |
| 2012/0287740 A1 | 11/2012 | Vimercati | |
| 2013/0088931 A1 | 4/2013 | Braceras et al. | |
| 2013/0114361 A1 | 5/2013 | Barth, Jr. et al. | |
| 2013/0194877 A1 * | 8/2013 | Yang | G11C 7/18 365/189.05 |

OTHER PUBLICATIONS

Takahashi et al., A New Contact Programming ROM Architecture for Digital Signal Processor, 1998 IEEE Symposium on VLSI Circuits Digest of Technical Papers, pp. 158-161.*

* cited by examiner

GATED-FEEDBACK SENSE AMPLIFIER FOR SINGLE-ENDED LOCAL BIT-LINE MEMORIES

BACKGROUND OF THE INVENTION

1. Field of the Invention

The present invention is related to memory devices, and more specifically to a gated-feedback sense amplifier circuit for sensing voltages of single-ended local bit-lines to generate a global bit-line output.

2. Description of Related Art

Sense amplifiers are used within dynamic logic circuits and more particularly within memory circuits to detect signals provided by local bit-line outputs of the storage array to generate a global bit-line output signal. The read access delay of the memory is generally limited by the capacitance of the bit-lines and the speed at which the voltage present on a bit-line can be reliably detected.

The sense amplifiers typically employed in memory devices are designed to quickly resolve the logic state from the voltage present on the local bit-line. The typical sense amplifier for single-ended bit-line sensing, such as in (embedded dynamic random-access memory) eDRAM designs is formed by a pair of cross-coupled inverters and an input circuit that buffers the local bit-line voltage(s). While differential bit-lines can be sensed directly due to their symmetrical inputs affecting the inputs to the sense amplifier symmetrically, with a single-ended bit-line input, the sense amplifier input is buffered since the sense amplifier's input also sources current due to the cross-coupled inverter configuration. The buffering causes additional delay, making a single-ended design typically slower than a differential design, which affects the read timing margin of the device.

It would therefore be desirable to provide a memory read circuit for a single-ended bit-line memory that has reduced delay/improved timing margin, along with reduced area and power consumption.

BRIEF SUMMARY OF THE INVENTION

The invention is embodied in a sense amplifier circuit, a memory device, and method that provides reduced memory read delay/improved timing margin, along with reduced area and power consumption. The method is a method of operation of the sense amplifier circuit.

The sense amplifier has an input for receiving a single-ended local bit-line signal, a pass device having a first terminal coupled to the input and a second terminal connected to a global bit-line evaluation node, a pair of cross-coupled inverters, and a first inverter of which has an input that is coupled directly to the global bit-line evaluation node. The output of the second inverter is selectively coupled to the global bit-line evaluation node in response to a control signal, so that when the pass device is active, the local bit line charges or discharges the global bit-line evaluation node without being affected substantially by a state of the output of the second inverter. In response to a second state of the at least one control signal, the output of the second inverter is coupled to the input of the first inverter to retain a state of a latch formed by the first inverter and the second inverter. An internal output control circuit of the second inverter interrupts the feedback provided by the second inverter in response to the control signal. A direct write-through capability can be provided to the global bit-line evaluation node, and the local bit-lines can be multiplexed by including additional pass devices coupled between the corresponding bit-lines and the global bit-line evaluation node.

The foregoing and other objectives, features, and advantages of the invention will be apparent from the following, more particular, description of the preferred embodiment of the invention, as illustrated in the accompanying drawings.

BRIEF DESCRIPTION OF THE SEVERAL VIEWS OF THE DRAWING

The novel features believed characteristic of the invention are set forth in the appended claims. The invention itself, however, as well as a preferred mode of use, further objectives, and advantages thereof, will best be understood by reference to the following detailed description of the invention when read in conjunction with the accompanying Figures, wherein like reference numerals indicate like components, and:

DETAILED DESCRIPTION OF THE INVENTION

The present invention relates to memory devices and other circuits in which sense amplifiers for sensing single-ended signals are desirable. Instead of the typical cross-coupled inverter circuit used in differential sensing, in the exemplary device disclosed herein, one of the inverters has an output control that interrupts the feedback from that inverter while sensing of a global bit-line evaluation node is performed, and then after the sensing is complete, the feedback is enabled to provide a latch that retains the value. The other inverter senses the bit-line input directly, so the local bit-lines can be multiplexed to the global bit-line evaluation node by individual pass devices. The local bit-lines are pre-charged to the power supply rail opposite the pre-charge power supply rail of the sense amplifier circuit. The intermediate voltage produced at the global bit-line evaluation node when evaluating a local bit-line that is in the pre-charge state is determined by the capacitance of the global bit-line evaluation node versus the local bit-line capacitance, so is not generally a mid-point voltage, but rather, a voltage close to the power supply rail opposite the pre-charge power supply rail of the sense amplifier circuit, so that the sense amplifier evaluates in response to the pre-charged state of the local bit-lines and does not evaluate if a selected storage cell overcomes the local bit-line pre-charge condition. A direct write feature can also be provided that sets the value of the global bit-line evaluation node for write-through operations.

Figure 1:
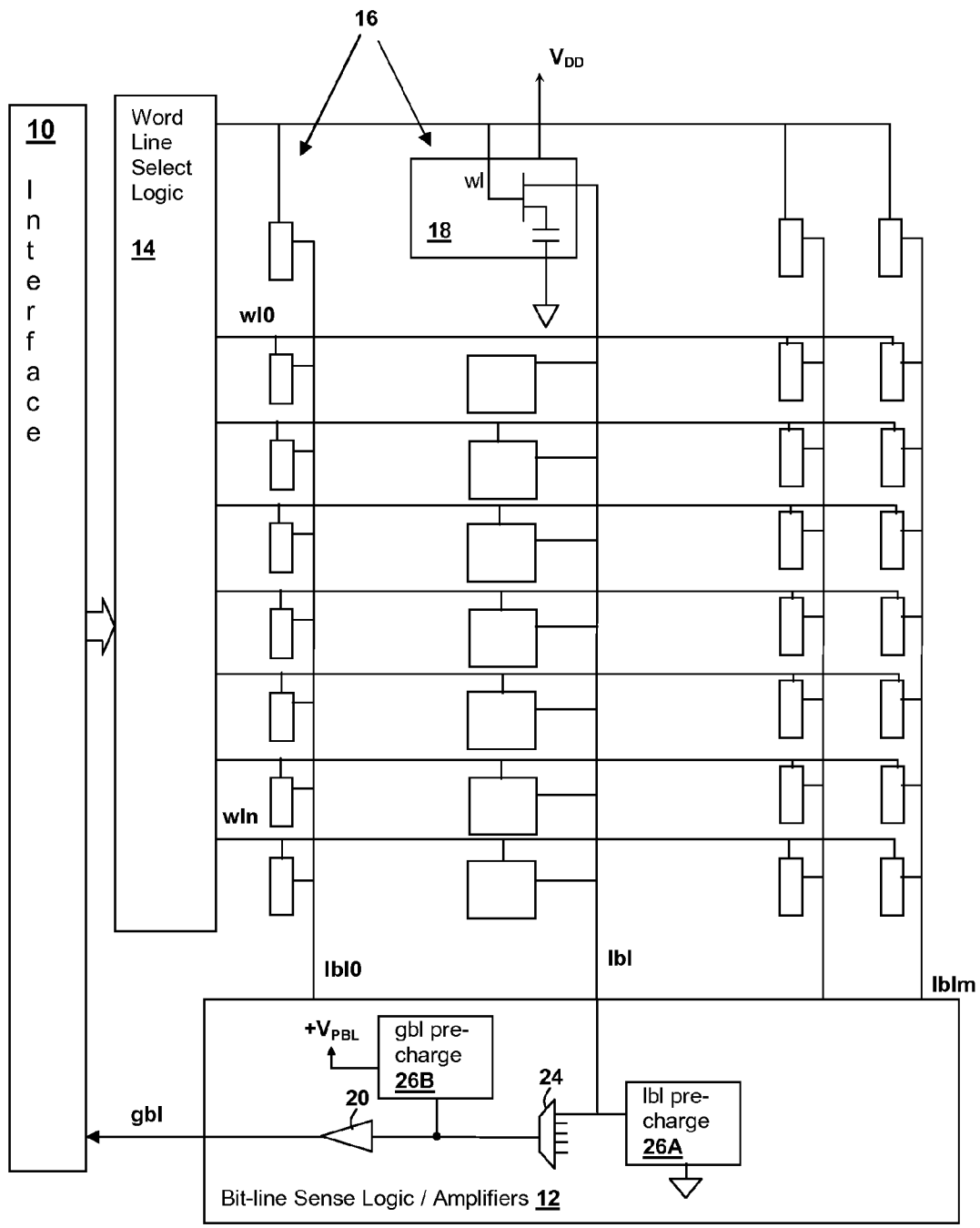
FIG. 1 is a block diagram illustrating an exemplary memory device.

With reference now to the figures, and in particular with reference to FIG. 1, an exemplary memory is shown, which may represent an eDRAM memory internal to a processor integrated circuit, a separate memory device coupled to a processor by a bus, or a memory for integration in another circuit. The memory includes multiple memory cell columns 16 assembled from memory cells 18 coupled to local bit-lines. The power supply input for the memory is +$V_{DD}$ During a read operation, if the capacitor in the particular eDRAM memory cell that is enabled for the read operation for a row is charged (in the example representing a logical "1" value with respect to that memory cell), a corresponding local bit-line lbl is pulled high by the read operation. Otherwise, local bit-line lbl remains at ground potential. Local bit-lines lbl0-lblm are provided to the bit-line sense logic/sense amplifiers block 12, which also contain pre-charge circuit 26A that, in the example memory array, pre-charges local bit-lines lbl0-lblm by grounding local bit-lines lbl0-lblm in between read cycles. The bit-line pre-charge voltages may differ in other designs, which may include pre-charged, equalized designs, or designs in which the memory cell logical-0 state voltage is substantially lower than the bit-line pre-charge voltage. Local bit-lines lbl0-lblm are provided to the bit-line sense logic/sense amplifiers block 12 that selects the appropriate column bit-line according to multiplexers 24 and provides the value of the memory cell to external circuits in response to a memory read operation via a global bit-line output signal gbl provided to an interface 10. In general, interface 10 will select from a number of global bit-lines, one for each sub-array within the memory. A row is selected by a particular word line enable signal wl0-wln asserted from a word line select logic 14. The present disclosure concerns particular sense amplifier designs that may be applied within sense logic/sense amplifiers block 12, according to the examples described below. A sense amplifier 20 for each global bit-line generates global bit-line output signal gbl. A global bit-line input signal is provided as an input to sense amplifier 20 and is pre-charged by a pre-charge circuit 26B to a logical-low voltage, ground in the example. In the example sense amplifiers described below, the pre-charged local bitline lbl0-lblm that is selected is coupled directly to the global bit-line input signal, which in the sense amplifier embodiments described below is a global bit-line evaluation node gble that evaluates when pre-charge circuit 26B is disabled and the local bit-line coupled to sense amplifier 20, unless the selected one of local bit-lines lbl has been set to a non-pre-charged state by the value stored in the memory cell 18 selected for the read operation.

Figure 2:
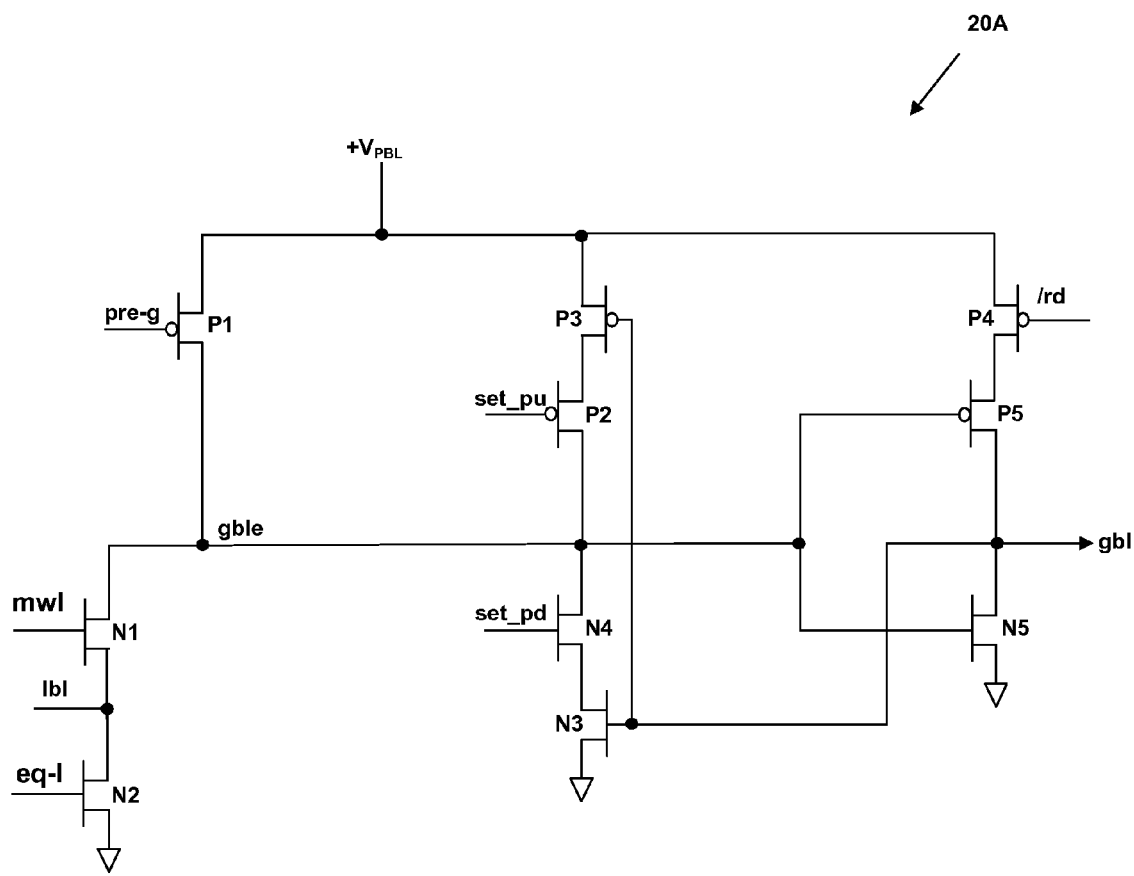
FIG. 2 is a schematic diagram of a sense amplifier 20A according to a first example that may be used in the memory device of FIG. 1.

Referring now to FIG. 2, a sense amplifier circuit 20A as may be used to implement sense amplifier 20 within the memory circuit of FIG. 1 is illustrated. The sense amplifier circuit is operated from power supply voltage Vpbl. The wordline wl for the corresponding row is used to generate a multiplexer control signal mwl that enables a transistor N1 during a read operation. Prior to the assertion of wordline signal wl, a local bit-line pre-charge control signal eq-l is asserted, turning on a transistor N2 in order to set the voltage on bit-line lbl to ground, to pre-charge the local bit-line lbl. The memory cell being accessed will increase the voltage on local bit-line lbl when wordline signal wl is asserted if a logical high-voltage state is set in the cell. The voltage on local bit-line lbl will remain unchanged if logical low-voltage state is set in the cell. Transistor N1 serves as a pass device that directly couples local bit-line lbl to a global bit-line evaluation node gble. Global bit-line evaluation node gble is pre-charged prior to the read operation to a polarity opposite the pre-charge state of local bit-line lbl by a transistor P1, in response to a global bit-line precharge control signal pre-g. When transistor N1 is turned on to start the local bit-line evaluation cycle, transistor P1 has been turned off, and also transistors P2 and N4 are also turned off by respective control signals set_pu and set_pd. Transistor N2 has also been turned off. Transistors P5 and N5 form a first inverter that generates a global bit-line output signal gbl from the state of global bit-line evaluation node gble. Transistors P3 and N3 form a second inverter that has an output enable circuit formed by transistors P2 and N4 which disable internal conduction paths of the second inverter so that the state of transistors P3 and N3 does not substantially affect the charge on global bit-line evaluation node gble while the value of local bit-line lbl is being evaluated. Once sufficient time has passed that the value of global bit-line evaluation node gble is confidently established by charge-sharing between local bit-line lbl and global bit-line evaluation node gble, control signals control signals set_pu and set_pd are asserted to turn on respective transistors P2 and N4, so that the output of the second inverter formed by transistors P3 and N3 is enabled, forming a latch that will hold the value of global bit-line gbl indefinitely until the next read cycle, or until a control signal /rd is de-asserted to indicate the end of the read cycle, in order to save power by eliminating leakage through transistors P5 and N5 by turning off a transistor P4. Other leakage paths are disabled when the pre-charge signal pre-g and control signals set_pu and set_pd are in their de-asserted states between read cycles.

Figure 3:
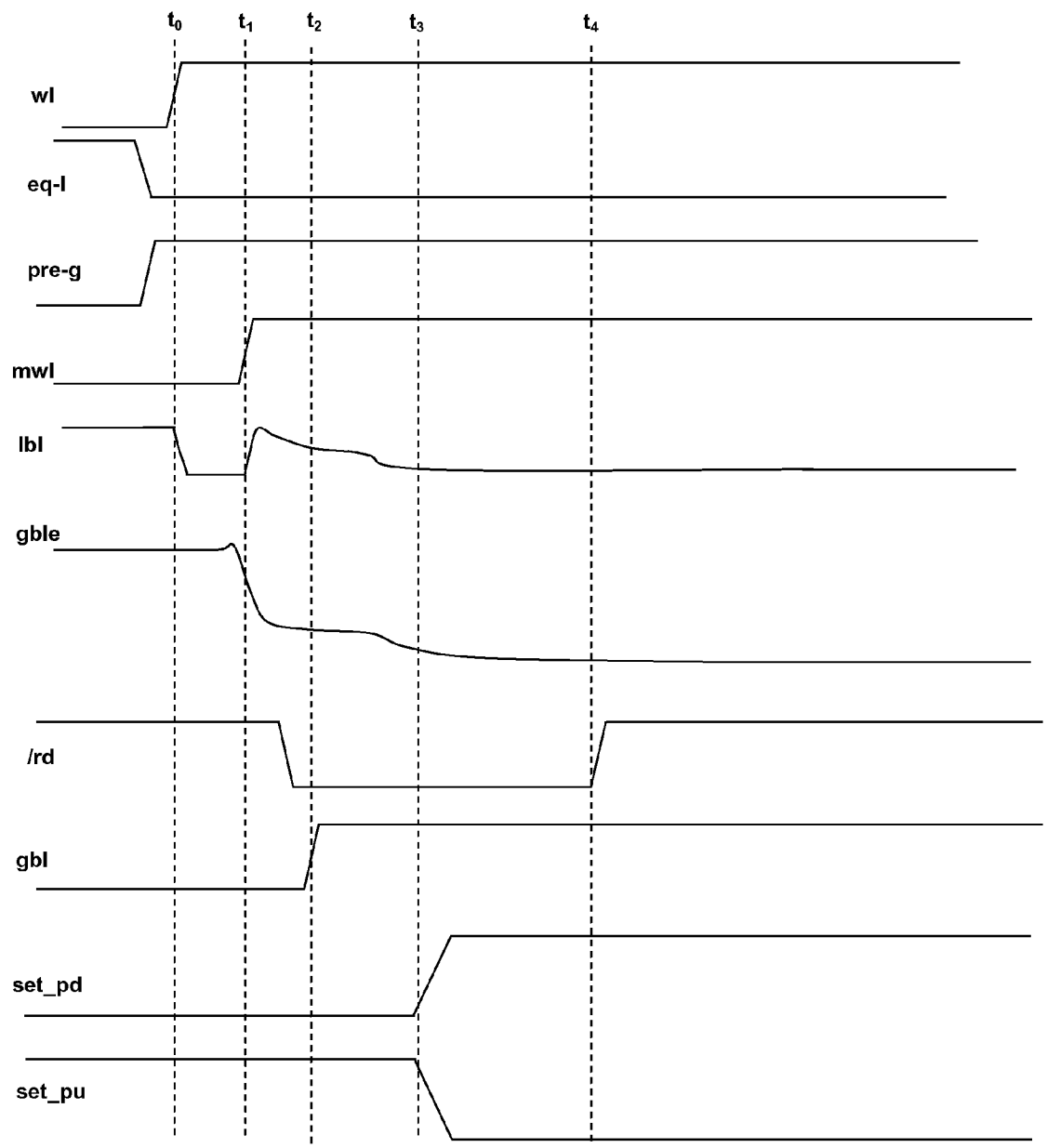
FIG. 3 is a timing diagram illustrating signals within sense amplifier 20A of FIG. 2.

Referring now to FIG. 3, the above-described operation of the sense amplifier 20A of FIG. 2 is shown in a timing diagram. Prior to time $t_0$, global bit-line pre-charge control signal pre-g has been asserted (lower voltage), local bit-line pre-charge control signal eq-l has also been asserted, and then global bit-line pre-charge control signal pre-g and local bit-line pre-charge control signal eq-l are de-asserted. At time $t_0$, word-line signal wl is asserted and local bit-line lbl evaluates to a logical-0 value (low voltage) as the memory cell corresponding to word-line wl is enabled. At time $t_1$, multiplexer control signal mwl is asserted and pass transistor N1 turns on to cause global bit-line evaluation node gble to start discharging. Local bit-line lbl has an initial rise due to charge sharing with global bit-line evaluation node gble, but both stabilize to a logical-0 (low voltage) state. At time $t_2$, control signal /rd is asserted so that the inverter formed by transistors P5 and N5 is operable to generate global bit-line output signal gbl which rises due to being the logical invert of the state of global bit-line evaluation node gble. At time $t_3$, control signals set_pu and set_pd are asserted, to enable the inverter formed by transistors P3 and N3 to complete the latch that holds the state of global bit-line output signal gbl by pulling global bit-line evaluation node gble to a logical-0 (low voltage) state with a low impedance path. After the read cycle is complete, i.e., after interface 10 has received the value of global bit-line output signal gbl, at time $t_4$ control signal /rd is de-asserted to reduce leakage.

Figure 4:
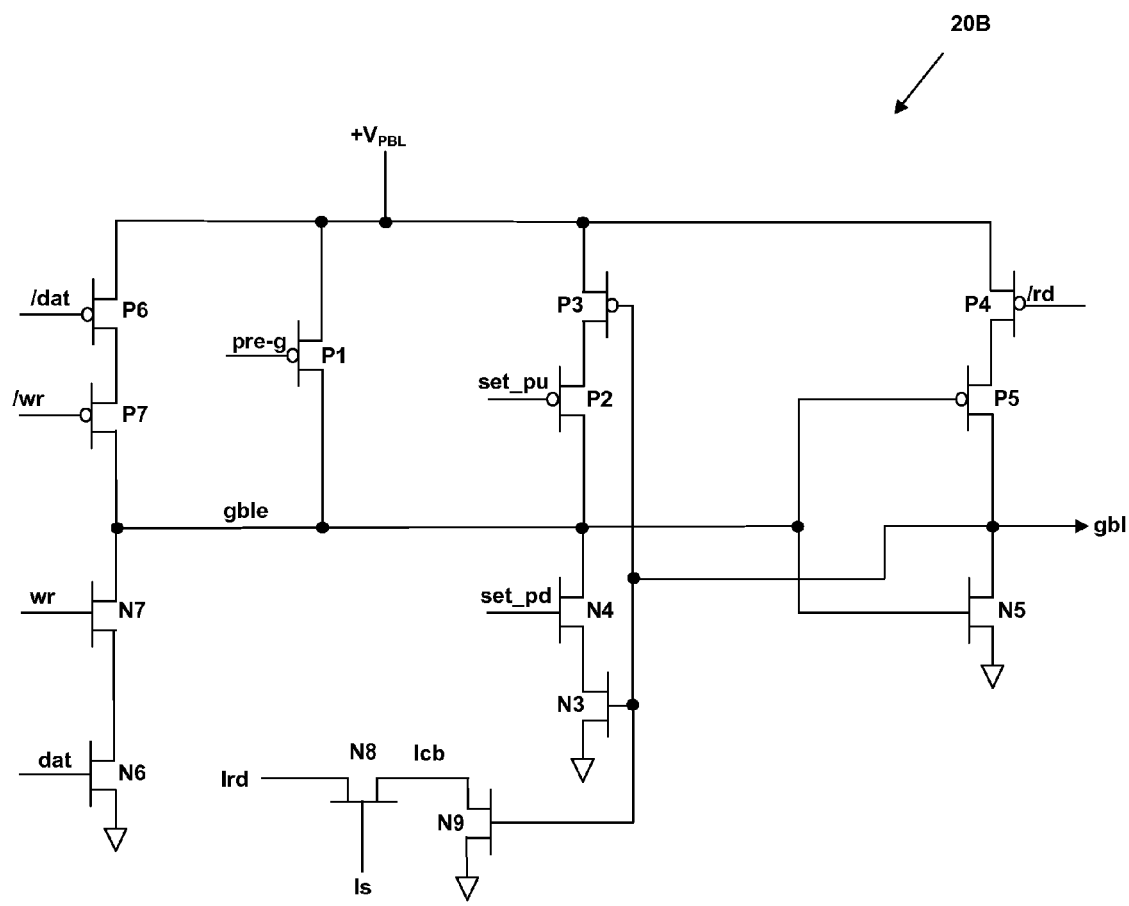
FIG. 4 is a schematic diagram of a sense amplifier 20B according to a second example that may be used in the memory device of FIG. 1.

Referring now to FIG. 4, another example sense amplifier 20B is shown, to illustrate how direct write feature can be incorporated in the sense amplifier circuit of FIG. 2. Sense amplifier 20B of FIG. 4 is similar to sense amplifier 20A of FIG. 2, so only differences between them will be described in further detail below. Transistors N1 and N2 have been removed for clarity. Transistors P6 and N6 receive complementary write data values /dat and dat, respectively and transistors P7 and N7 receive complementary write strobe control signals /wr and wr. By activating write strobe control signals /wr and wr, the value represented by complementary write data values /dat and dat is written to global bit-line evaluation node gble for testability. Transistors N8 and N9 provide a write-through output signal lrd that is also needed for testability and reflects the complement of global bit-line evaluation node gble.

Figure 5:
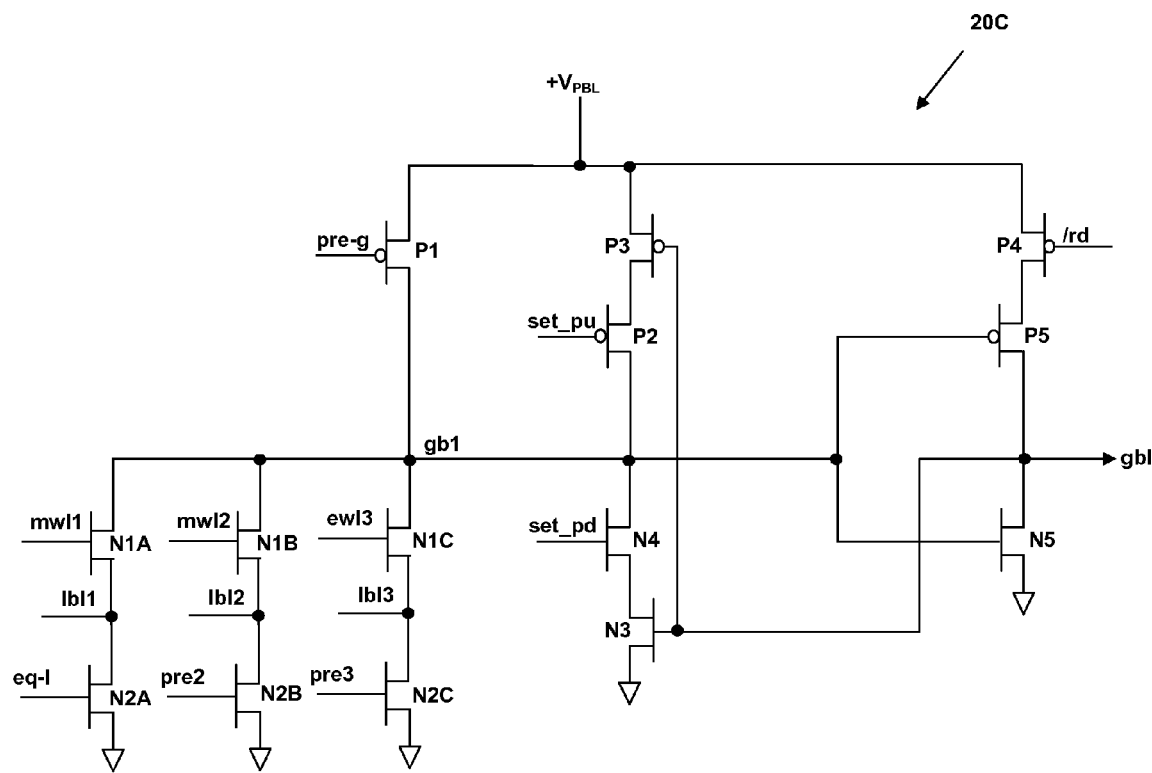
FIG. 5 is a schematic diagram of a sense amplifier 20C according to a third example that may be used in the memory device of FIG. 1.

Referring now to FIG. 5, yet another example sense amplifier 20C is shown, to illustrate how bit-line multiplexing can be incorporated in the sense amplifier circuit 20A of FIG. 2. Sense amplifier 20C of FIG. 5 is similar to sense amplifier 20A of FIG. 2, so only differences between them will be described in further detail below. Transistors N1 and N2 have been replaced by a transistor pair N1A, N2A, a transistor pair N1B, N2B and a transistor pair N1C, N2C. One of transistors N2A-N2C is activated to equalize the corresponding local bit-lines lbl1-lbl3 and then one of transistors N3A-N3C is activated at the beginning of the evaluation of global bit-line evaluation node gble to evaluate the state of the corresponding local bit-line lbl1-lbl3 to generate global bit-line output signal gbl.

Figure 6:
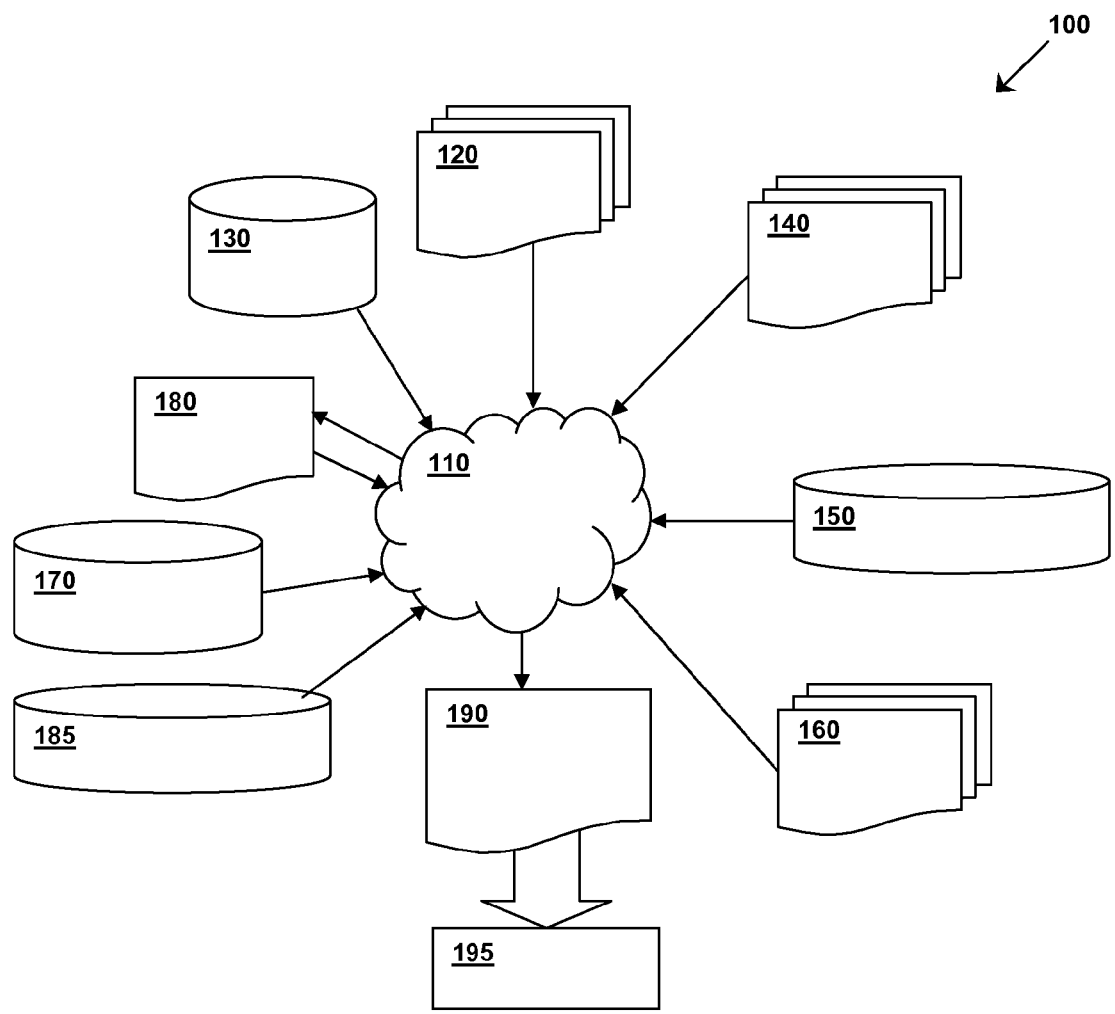
FIG. 6 is a flow diagram of a design process that can be used to fabricate, manufacture and test the memory device of FIG. 1.

FIG. 6 shows a block diagram of an exemplary design flow 100 used for example, in semiconductor IC logic design, simulation, test, layout, and manufacture. Design flow 100 includes processes, machines and/or mechanisms for processing design structures or devices to generate logically or otherwise functionally equivalent representations of the design structures and/or devices described above and shown in FIGS. 1-2 and 4-5. The design structures processed and/or generated by design flow 100 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 100 may vary depending on the type of representation being designed. For example, a design flow 100 for building an application specific IC (ASIC) may differ from a design flow 100 for designing a standard component or from a design flow 100 for instantiating the design into a programmable array, for example a programmable gate array (PGA) or a field programmable gate array (FPGA). FIG. 6 illustrates multiple such design structures including an input design structure 120 that is preferably processed by a design process 110. Input design structure 120 may be a logical simulation design structure generated and processed by design process 110 to produce a logically equivalent functional representation of a hardware device. Input design structure 120 may also or alternatively comprise data and/or program instructions that when processed by design process 110, generate a functional representation of the physical structure of a hardware device. Whether representing functional and/or structural design features, input design structure 120 may be generated using electronic computer-aided design (ECAD) such as implemented by a core developer/designer. When encoded on a machine-readable data transmission, gate array, or storage medium, input design structure 120 may be accessed and processed by one or more hardware and/or software modules within design process 110 to simulate or otherwise functionally represent an electronic component, circuit, electronic or logic module, apparatus, device, or system such as those shown in FIGS. 1-2 and 4-5. As such, input design structure 120 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 110 preferably employs and incorporates hardware and/or software modules for synthesizing, translating, or otherwise processing a design/simulation functional equivalent of the components, circuits, devices, or logic structures shown in FIGS. 1-2 and 4-5 to generate a Netlist 180 which may contain design structures such as input design structure 120. Netlist 180 may comprise, for example, compiled or otherwise processed data structures representing a list of wires, discrete components, logic gates, control circuits, I/O devices, models, etc. that describes the connections to other elements and circuits in an integrated circuit design. Netlist 180 may be synthesized using an iterative process in which netlist 180 is resynthesized one or more times depending on design specifications and parameters for the device. As with other design structure types described herein, netlist 180 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 110 may include hardware and software modules for processing a variety of input data structure types including Netlist 180. Such data structure types may reside, for example, within library elements 130 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 140, characterization data 150, verification data 160, design rules 170, and test data files 185 which may include input test patterns, output test results, and other testing information. Design process 110 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 110 without deviating from the scope and spirit of the invention. Design process 110 may also include modules for performing standard circuit design processes such as timing analysis, verification, design rule checking, place and route operations, etc. Design process 110 employs and incorporates logic and physical design tools such as HDL compilers and simulation model build tools to process input design structure 120 together with some or all of the depicted supporting data structures along with any additional mechanical design or data (if applicable), to generate a second design structure 190. Design structure 190 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to input design structure 120, design structure 190 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-2 and 4-5. In one embodiment, design structure 190 may comprise a compiled, executable HDL simulation model that functionally simulates the devices shown in FIGS. 1-2 and 4-5.

Design structure 190 may also employ a data format used for the exchange of layout data of integrated circuits and/or symbolic data format (e.g. information stored in a GDSII (GDS2), GL1, OASIS, map files, or any other suitable format for storing such design data structures). Design structure 190 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-2 and 4-5. Design structure 190 may then proceed to a stage 195 where, for example, design structure 190: proceeds to tape-out, is released to manufacturing, is released to a mask house, is sent to another design house, is sent back to the customer, etc.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A dynamic bit-line sensing circuit for providing a global bit-line output of a storage array, the circuit comprising:
    an input for receiving a single-ended local bit-line signal;
    a pass device having a first terminal coupled to the input and a second terminal directly connected to a global bit-line evaluation node;
    a first inverter having an input directly connected to the global bit-line evaluation node; and
    a second inverter having an input coupled to an output of the first inverter, wherein an output of the first inverter provides the global bit-line output, and wherein the output of the second inverter is further selectively coupled to the global bit-line evaluation node, wherein in response to a first state of at least one control signal, the output of the second inverter is de-coupled from the global bit-line evaluation node so that when the pass device is active the local bit line charges or discharges the global bit-line evaluation node without being affected substantially by a state of the output of the second inverter, and wherein in response to a second state of the at least one control signal the output of the second inverter is coupled to the input of the first inverter to retain a state of a latch formed by the first inverter and the second inverter.

2. The dynamic bit-line sensing circuit of claim 1, wherein the first terminal of the pass device is directly connected to a local bit-line of the storage array.

3. The dynamic bit-line sensing circuit of claim 1, wherein the second inverter includes at least one output disable transistor that disables at least one corresponding output conduction paths of the second inverter responsive to the at least one control signal, wherein when the at least one control signal is in the second state, a state of the global bit-line evaluation node assumes a state of the output of the second inverter, and wherein when the at least one control signal is in the first state the at least one output disable transistor is off, preventing the output of the second inverter from controlling the state of the global bit-line evaluation node.

4. The dynamic bit-line sensing circuit of claim 1, wherein the second inverter comprises:
    a first p-type transistor having a gate terminal directly connected to the output of the first inverter and a first drain or source terminal directly connected to a positive power supply rail;
    a second p-type transistor having a gate terminal directly connected to the at least one control signal, a first drain or source terminal directly connected to a second drain or source terminal of the first p-type transistor and a second drain or source terminal directly connected to the global bit-line evaluation node;
    a first n-type transistor having a gate terminal directly connected to the at least one control signal and a first drain or source terminal directly connected to the global bit-line evaluation node; and
    a second n-type transistor having a gate terminal directly connected to the output of the first inverter, a first drain or source terminal directly connected to a second drain or source terminal of the first n-type transistor and a second drain or source terminal directly connected to a negative power supply rail.

5. The dynamic bit-line sensing circuit of claim 4, wherein the at least one transistor is a pair of transistors that, responsive to the at least one control signal, isolate both a pull-up and a pull-down output conduction path of the second inverter.

6. The dynamic bit-line sensing circuit of claim 1, wherein the pass device is a first pass device, wherein the single-ended local bit-line signal is a first local bit-line signal, and further comprising at least one additional pass device coupled between at least one additional input and the global bit-line evaluation node for receiving at least one additional single-ended local bit-line signal, wherein the first pass device and the at least one additional pass device form a local bit-line multiplexer for selecting between the first local bit-line signal and the at least one additional local bit-line signal.

7. The dynamic bit-line sensing circuit of claim 1, further comprising at least one second pass device coupled between the global bit-line evaluation node and at least one write data input, wherein the at least one second pass device is responsive to a write enable signal, whereby a state of the at least one write data input is imposed on the global bit-line evaluation node when the write enable signal is active.

8. The dynamic bit-line sensing circuit of claim 1, wherein the global bit-line evaluation node is pre-charged to a power supply rail voltage of the dynamic bit-line sensing circuit and wherein the local bit-line signal is pre-charged to a power supply return voltage of the dynamic bit-line sensing circuit.

9. A memory, comprising:
    an interface circuit for coupling the memory device to a processor;
    a storage array having rows of storage elements selectively enabled by word-lines to assert stored values on corresponding column local bit-lines; and
    a bit-line sense logic including sense amplifiers for generating corresponding global bit-line output signals, the sense amplifiers comprising an input for receiving a single-ended local bit-line signal, a pass device having a first terminal coupled to the input and a second terminal directly connected to a global bit-line evaluation node, a first inverter having an input directly connected to the global bit-line evaluation node, and a second inverter having an input coupled to an output of the first inverter, wherein an output of the first inverter provides the global bit-line output, and wherein the output of the second inverter is further selectively coupled to the global bit-line evaluation node, wherein in response to a first state of at least one control signal, the output of the second inverter is de-coupled from the global bit-line evaluation node so that when the pass device is active the local bit line charges or discharges the global bit-line evaluation node without being affected substantially by a state of the output of the second inverter, and wherein in response to a second state of the at least one control signal the output of the second inverter is coupled to the input of the first inverter to retain a state of a latch formed by the first inverter and the second inverter.

10. The memory of claim 9, wherein the first terminal of the pass device is directly connected to a local bit-line of the storage array.

11. The memory of claim 9, wherein the second inverter includes at least one output disable transistor that disables at least one corresponding output conduction paths of the second inverter responsive to the at least one control signal, wherein when the at least one control signal is in the second state, a state of the global bit-line evaluation node assumes a state of the output of the second inverter, and wherein when the at least one control signal is in the first state the at least one output disable transistor is off, preventing the output of the second inverter from controlling the state of the global bit-line evaluation node.

12. The memory of claim 11, wherein the second inverter comprises:
a first p-type transistor having a gate terminal directly connected to the output of the first inverter and a first drain or source terminal directly connected to a positive power supply rail;
a second p-type transistor having a gate terminal directly connected to the at least one control signal, a first drain or source terminal directly connected to a second drain or source terminal of the first p-type transistor and a second drain or source terminal directly connected to the global bit-line evaluation node;
a first n-type transistor having a gate terminal directly connected to the at least one control signal and a first drain or source terminal directly connected to the global bit-line evaluation node; and
a second n-type transistor having a gate terminal directly connected to the output of the first inverter, a first drain or source terminal directly connected to a second drain or source terminal of the first n-type transistor and a second drain or source terminal directly connected to a negative power supply rail.

13. The memory of claim 12, wherein the at least one transistor is a pair of transistors that, responsive to the at least one control signal, isolate both a pull-up and a pull-down output conduction path of the second inverter.

14. A method of operation of a dynamic bit-line sensing circuit for providing a global bit-line output of a storage array, the method comprising:
receiving a single-ended local bit-line signal;
coupling the single-ended local bit-line signal to a global bit-line evaluation node with a pass device;
sensing a state of the global bit-line evaluation node with a first inverter having an input directly connected to the global bit-line evaluation node and an output coupled to the global bit-line output;
selectively holding a state of the global bit-line output in response to a second state of at least one control signal by coupling an input of a second inverter to the global bit-line output and an output of the second inverter to the global bit-line evaluation node; and
preventing the second inverter from substantially affecting the state of the global bit-line evaluation node prior to completion of the sensing by de-coupling the output of the second inverter from the global bit-line evaluation node in response to a first state of the at least one control signal.

15. The method of claim 14, wherein the coupling comprises connecting a first terminal of the pass device directly to a local bit-line of the storage array.

16. The method of claim 14, wherein the preventing is performed disabling at least one output conduction path of the second inverter responsive to the at least one control signal, wherein when the at least one control signal is in the second state, a state of the global bit-line evaluation node assumes a state of the output of the second inverter, and wherein when the at least one control signal is in the first state the at least one output conduction path is disabled, preventing the output of the second inverter from controlling the state of the global bit-line evaluation node.

17. The method of claim 16, wherein the at least one output conduction path is a pair of output conduction paths including both a pull-up and a pull-down output conduction path of the second inverter.

18. The method of claim 14, wherein the pass device is a first pass device, wherein the single-ended local bit-line signal is a first local bit-line signal, and wherein the method further comprises:
coupling at least one additional single-ended local bit-line signal to the global bit-line evaluation node with at least one additional pass device;
selecting from among the first local bit-line signal and the at least one additional single-ended local bit-line signal by selectively enabling one of the first pass device or the at least one additional pass device.

19. The method of claim 14, further coupling the global bit-line evaluation node to at least one write data input in response to a write enable signal, whereby a state of the at least one write data input is imposed on the global bit-line evaluation node when the write enable signal is active.

20. The method of claim 14, further comprising:
pre-charging the global bit-line evaluation node to a power supply rail voltage of the dynamic bit-line sensing circuit; and
pre-charging the local bit-line signal to a power supply return voltage of the dynamic bit-line sensing circuit.

* * * * *